United States Patent
Pan

(10) Patent No.: US 7,163,844 B2
(45) Date of Patent: Jan. 16, 2007

(54) MONOLITHIC COMMON CARRIER

(75) Inventor: Alfred I-Tsung Pan, Sunnyvale, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 133 days.

(21) Appl. No.: 10/692,884

(22) Filed: Oct. 24, 2003

(65) Prior Publication Data

US 2004/0080576 A1 Apr. 29, 2004

Related U.S. Application Data

(62) Division of application No. 09/655,197, filed on Sep. 5, 2000, now Pat. No. 6,812,564.

(51) Int. Cl.
*H01L 21/00* (2006.01)

(52) U.S. Cl. ............... 438/118; 438/21; 438/401; 438/125; 438/455

(58) Field of Classification Search ............... 438/107, 438/455, 612, 613, 110, 108, 723, 462, 118, 438/21, 119, 125, 401
See application file for complete search history.

(56) References Cited

U.S. PATENT DOCUMENTS

| | | | | |
|---|---|---|---|---|
| 4,254,445 A | * | 3/1981 | Ho | 361/728 |
| 4,326,180 A | * | 4/1982 | Ferri | 333/246 |
| 4,646,142 A | * | 2/1987 | Levine | 348/263 |
| 4,797,780 A | * | 1/1989 | Moser et al. | 361/321.3 |
| 4,890,157 A | * | 12/1989 | Wilson | 257/668 |
| 5,055,425 A | * | 10/1991 | Leibovitz et al. | 216/15 |
| 5,055,907 A | * | 10/1991 | Jacobs | 257/773 |
| 5,276,289 A | * | 1/1994 | Satoh et al. | 174/260 |
| 5,280,193 A | * | 1/1994 | Lin et al. | 257/723 |
| 5,285,108 A | * | 2/1994 | Hastings et al. | 257/712 |
| 5,319,244 A | * | 6/1994 | Papathomas et al. | 257/701 |
| 5,371,029 A | * | 12/1994 | Abdo et al. | 29/846 |
| 5,394,010 A | * | 2/1995 | Tazawa et al. | 257/686 |
| 5,450,109 A | * | 9/1995 | Hock | 347/67 |
| 5,474,458 A | * | 12/1995 | Vafi et al. | 439/91 |
| 5,510,273 A | * | 4/1996 | Quinn | 156/160 |
| 5,565,113 A | * | 10/1996 | Hadimioglu et al. | 216/2 |
| 5,625,221 A | * | 4/1997 | Kim et al. | 257/686 |
| 5,654,121 A | * | 8/1997 | Eichhorn et al. | 430/157 |
| 6,100,594 A | * | 8/2000 | Fukui et al. | 257/777 |
| 6,123,410 A | * | 9/2000 | Beerling et al. | 347/42 |
| 6,163,068 A | * | 12/2000 | Yao | 257/672 |
| 6,248,942 B1 | * | 6/2001 | Hebestreit et al. | 84/297 S |
| 6,362,117 B1 | * | 3/2002 | Houston | 438/585 |
| 6,372,539 B1 | * | 4/2002 | Bayan et al. | 438/106 |
| 6,473,966 B1 | * | 11/2002 | Kohno et al. | 29/890.1 |
| 7,005,319 B1 | * | 2/2006 | Chen et al. | 438/107 |
| 7,107,562 B1 | * | 9/2006 | Schroder et al. | 716/11 |

(Continued)

FOREIGN PATENT DOCUMENTS

DE 199 44 042 A1 * 4/2001

*Primary Examiner*—M. Wilczewski

(57) ABSTRACT

A common carrier for forming multiple printheads thereon and method of forming thereof is described. The common carrier includes a carrier substrate for adhering a plurality of unprocessed, integrateable semiconductor chips. Once adhered, the carrier substrate is lithographically processed to form a plurality of integrated circuit (IC) printhead chips such that alignment of the IC chips on the carrier substrate has the precision of lithographic alignment tolerances which is well within printhead alignment requirements.

23 Claims, 3 Drawing Sheets

U.S. PATENT DOCUMENTS

2001/0014488 A1* 8/2001 Akram .................. 438/106
2002/0041026 A1* 4/2002 Ball ..................... 257/734
2003/0036249 A1* 2/2003 Bauer et al. ............. 438/460
2004/0104466 A1* 6/2004 Miller et al. ............ 257/691

* cited by examiner

MONOLITHIC COMMON CARRIER

CROSS-REFERENCES TO RELATED APPLICATIONS

This application is a divisional of prior application Ser. No. 09/655,197 filed Sep. 5, 2000 now U.S. Pat. No. 6,812,564.

FIELD OF THE INVENTION

The present invention relates generally to precision alignment of integrated circuit devices on a common carrier. More specifically, the present invention relates to precision alignment of integrated circuit devices corresponding to thermal ink jets on a common carrier.

Articles and publications set forth herein are presented for the information contained therein: none of the information is admitted to be statutory "prior art" and we reserve the right to establish prior inventorship with respect to any such information.

BACKGROUND ART

It is well known in the art to use an inkjet printer for applications that require a hardcopy printout on a sheet of media. For example, it is commonplace to use an inkjet printer to print on sheets of paper, transparencies, labels, and the like. In a typical inkjet printer, a carriage holds one or more ink cartridges. Each cartridge has an inkjet printhead (pen) that includes several nozzles from which ink is ejected in a direction that causes the ink to impinge on the sheet of media. Typically, the carriage must travel across the media so that each pen can reach the full area of the media. The media to be printed on is usually driven along a media axis of motion and the pen is driven along a carriage axis of motion that is perpendicular to the media axis. In color inkjet printers, two or more cartridges are needed to print color images. For instance, a color inkjet printer can have four cartridges (black, cyan, magenta, and yellow) with a pen for each color. Consequently, in a four cartridge printer, the carriage must travel the width of the media, plus the width of the four pens, plus the space between pens. Therefore, the width of the inkjet printer is determined to a large extent by the distance the carriage must travel in order to print images on the full area of the media. For example, in an inkjet plotter, the carriag may have to travel a distance greater than the width of a D-size sheet of media.

Because the carriage must travel across the media, the time it takes to print images includes the travel time for the carriage. Additionally, the mechanical components that move the carriage add to the complexity, size, and weight of the printer and are a source of noise and vibration that can be annoying to a user of the printer.

Moreover, the pens in inkjet printers require periodic alignment to ensure consistent quality in the printed image. Because the pens are mounted in separate cartridges, there is always a risk of misalignment between pens, particularly when one or more cartridges are replaced.

Prior attempts to solve the above mentioned limitations and disadvantages of multiple cartridge inkjet printers include mounting a plurality of inkjet printheads onto a wide substrate such as a multi-layer ceramic substrate or flexible substrate. Those solutions have several disadvantages.

First, expensive precision tooling is required to align the printheads to the substrate. Second, a mismatch between the coefficient of thermal expansion for the printhead and the substrate can result in thermal induced stress on the interconnect used to electrically connect the substrate to the printheads. Additionally, the mismatch can result in misalignment between the substrate and the printheads. Third, the interconnect, the materials used for the substrate, and adhesives used to attach the printheads to the substrate are subject to failures due to the corrosive effects of the ink used in inkjet printers. Forth, the inkjet pens are sensitive to temperature variations caused by waste heat from the printheads. The substrate must have a high thermal conductivity so that the waste heat can be dissipated. If the substrate has a low thermal conductivity, then the waste heat can raise the temperature of the pens resulting in an increase in the pens drop volume. Subsequently, a temperature differential exists among the printheads so that the drop volumes of the printheads can vary depending on their location on the substrate. Ideally, th thermal conductivity of the substrate and the printheads would be identical so that there is no temperature differential between the printheads resulting in consistent drop volumes among the printheads.

One manner in which multiple printhead alignment can be achieved is described in an application filed by the assignee of the present application. According to this technique, a common carrier substrate is formed having one or more precisely formed pockets. The sides of each pocket are formed to have a side profile that is a near perfect compliment of the side profile of each of a set of fully integrated chips. Due to the complementary side profiles, the chip can be positioned in near perfect self-alignment with all other chips on the substrate. Hence alignment according to this technique is achieved by the precise formation of the pockets and the precise formation of the complimentary edges of the chips.

Therefore, there is a need for a carrier that can mount one or more inkjet printheads in alignment with one another without the need to form precise pockets within the carrier.

SUMMARY OF THE INVENTION

Broadly, the present invention is embodied in a common carrier that includes a carrier substrate for adhering a plurality of unprocessed integrateable chips. Once adhered, the carrier substrate is lithographically processed to form integrated chips that are aligned on the carrier substrate is within lithographic alignment tolerances.

In accordance with one embodiment of the common carrier of the present invention and method of forming thereof, a common carrier is formed to include a plurality of integrated chips and a carrier substrate, where the unprocessed integrateable chip form of the integrated chips are first adhered using a first placement alignment tolerance to the carrier substrate and then are lithographically processed to obtain the plurality of integrated chips on the carrier substrate such that the integrated chips are aligned with each other and the substrate with a second alignment tolerance having lithographic processing precision.

In one embodiment the plurality of integrated chips correspond to a plurality of inkjet printhead IC devices.

DETAILED DESCRIPTION

Figure 1:
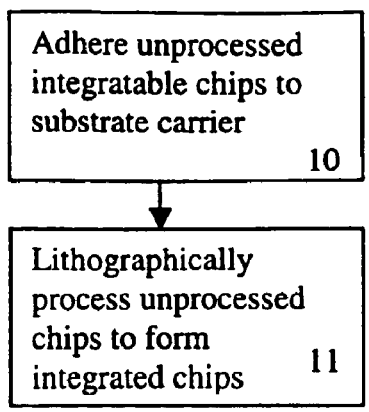
FIG. 1 shows a first embodiment of the method of forming a monolithic common carrier.

In the following detailed description and in the several figures of the drawings, like elements are identified with like reference numerals.

In general, the present invention is a monolithic common carrier having adhered on its upper surface a plurality of integrated chips, in which the integrated chips are aligned according to lithographic process tolerances. The monolithic common carrier is formed by initially adhering unprocessed integrateable chips to a carrier substrate and then subsequently lithographically processing the chips to form integrated chips on the carrier substrate. As a result, lithographic processing alignment precision is achieved between the integrated chips and between the substrate and the integrated chips. One of the main advantages of this type of formation of a common carrier is that integrated chips formed on the carrier are aligned according to lithographic tolerances without the requirement of a precision placement tool.

It should be noted that for purposes of the present invention an unprocessed, integrateable chip is defined as a workpiece of material which can be lithographically processed to form an integrated device or chip, and which has not yet been exposed to lithographic processing steps. In addition, an integrated device is formed by exposing a workpiece of material to lithographic processing steps to alter the electrical, electromechanical, mechanical or physical characteristics of the workpiece.

FIG. 1 shows one embodiment of the method of forming the monolithic common carrier of the present invention including the steps of adhering a plurality of unprocessed, integrateable chips to a carrier substrate using a first placement alignment tolerance (step 10) and lithographically processing the plurality of unprocessed chips to form a plurality of integrated chips (step 11), where the integrated chips are aligned according to lithographic processing tolerances.

Figure 2:
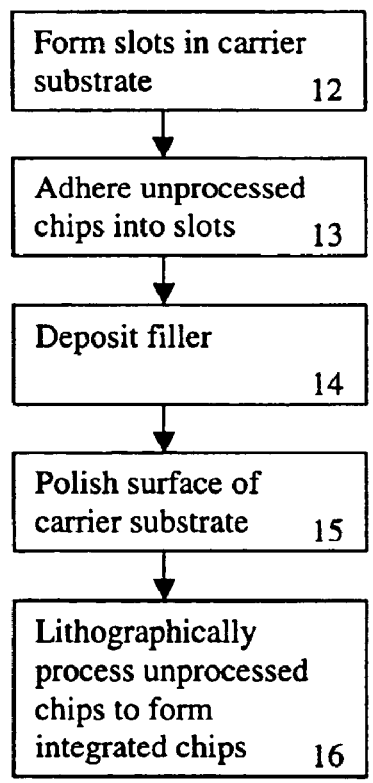
FIG. 2 shows a second embodiment of the method of forming a monolithic common carrier in which unprocessed, integrateable chips are adhered into slots.

FIG. 2 shows a second embodiment of the method of forming the common carrier of the present invention. In this embodiment, a plurality of slots is formed within the upper surface of the carrier substrate (step 12) and a plurality of unprocessed, integrateable chips is adhered into the slots— one chip per slot (step 13). Next, a filler is deposited to fill the gaps formed between the interior edges of the slots and the peripheral edges of the unprocessed chips (step 14). The surface of the carrier substrate is then polished so at to smooth out the surface topology of the carrier substrate such that the top surface of the chips and the carrier substrate are in essentially the same plane (step 15). This step is performed so as to put the carrier substrate in condition for subsequent lithographic processing steps. Next, the unprocessed, integrateable chips are lithographically processed so as to form a plurality of integrated circuit chips on the carrier substrate (step 16). Optionally, if the carrier substrate is embodied as multiple smaller carrier substrates, the carrier substrate can then be separated into individual smaller carrier substrates (not shown in FIG. 2).

Figure 3:
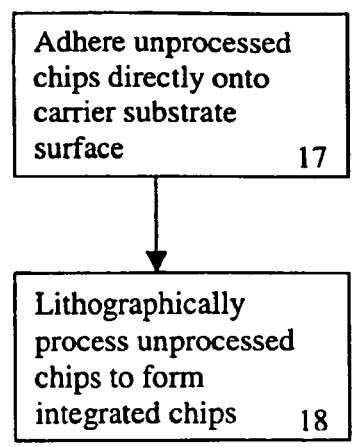
FIG. 3 shows a third embodiment of the method of forming a monolithic common carrier in which unprocessed, integrateable chips are adhered directly onto the surface of a carrier substrate.

In an alternative embodiment of the method (shown in FIG. 3), unprocessed, integrateable chips are adhered directly to the top surface of the carrier substrate instead of into formed slots (step 17) and then the unprocessed chips are lithographically processed to form integrated chips (step 18). In this embodiment, due to the uneven surface of the carrier substrate resulting from adhering the chips directly to the upper surface, subsequent processing steps are adapted to account for the uneven topology of the carrier substrate. For instance, after adhering the unprocessed chips to the carrier substrate, the lithographic processing step of depositing photoresist onto the surface of the substrate carrier is performed using curtain or sheet coating, instead of the conventional spin-type photoresist deposition technique. Other alternative lithographic processing steps may be required to account for the uneven topology of the carrier surface.

In one embodiment in which the unprocessed chips are lithographically processed to form integrated circuit devices, conductive nodes or bonding pads are formed on the integrated circuit so as to conductively wire bond the integrated circuit chip to one of another integrated circuit and/or the carrier substrate.

Figure 4:
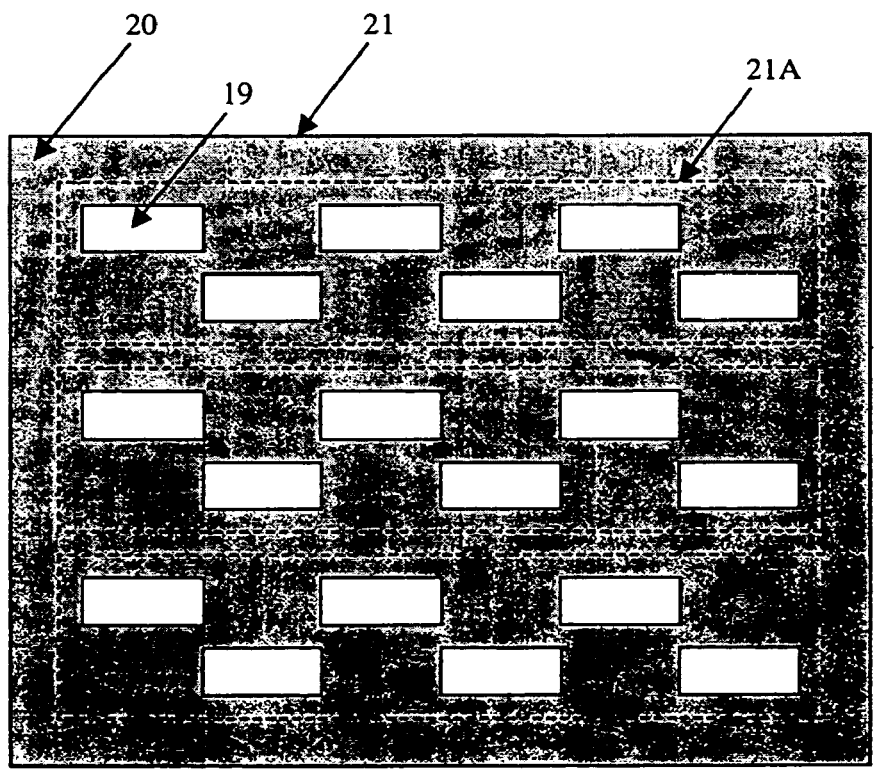
FIG. 4 shows a plan view of slots formed into a carrier substrate.

FIG. 4 shows a carrier substrate having a plurality of slots 19 formed into the upper surface 20 of the carrier substrate 21 (FIG. 4). Slot dimensions (i.e., length and width) are designed to be slightly larger than the dimensions (i.e., length and width) of the unprocessed chips to account for placement tool misalignment of the chips. In this embodiment, the placement tool has a tolerance that is significantly less than the lithographic processing steps to be performed in subsequent steps. In one embodiment, the placement tool has a tolerance range of +/−1 milimeter. The depth of the slots is designed such that the upper surface of the unprocessed chips when adhered into the slot is essentially in the same plane as the upper surface of the carrier substrate.

In accordance with one embodiment of the common carrier, the carrier substrate and the adhesive are composed of a material that has essentially the same coefficient of thermal expansion (CTE) as the unprocessed chips. The reason for the carrier substrate and adhesive having the same CTE as the integrated chips is that in the event of temperature fluctuations, the substrate, adhesive and integrated chips will expand at the same rate, thereby minimizing structural damage to the finished common carrier during periods of temperature fluctuations.

The size of the carrier substrate can be selected dependent on subsequent processing steps for forming the common carrier. For instance, in one embodiment, the carrier substrate size is selected to be adaptable to subsequent lithographic processing steps or equipment used to perform the subsequent lithographic processing steps. Carrier substrate size is also dependent on the number of devices that are to be adhered on it. In one embodiment in which the unprocessed chips are silicon chips, the carrier substrate and adhesive can be composed of polysilicon, glass, metal, ceramic, or similar compositions.

It should be noted that in another embodiment, the size of carrier substrate 21 can be selected so that it can form a plurality of smaller carrier substrates. For example, FIG. 4 shows three carrier substrates 21A (dashed lines). In this embodiment, multiple carrier substrates 21A can be formed simultaneously and then separated in later processing st ps. In one embodiment, the adhesive is selected so as to retain adher nce reliability when exposed to subsequent processing steps performed on the common carrier.

Figure 5A:
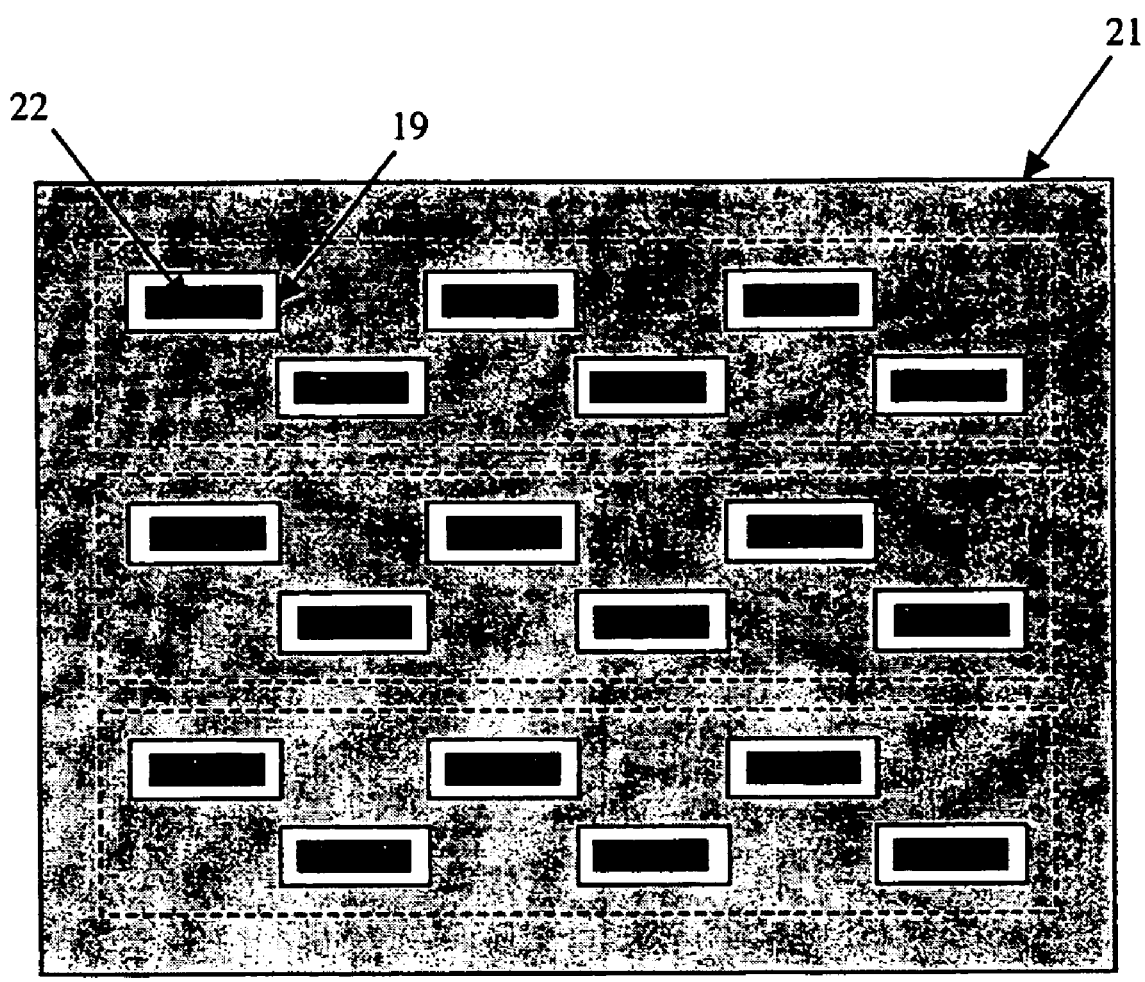
FIGS. 5A and 5B shows a plan view of unprocessed, integrateable chips adhered within the carrier substrate slots.
Figure 5B:
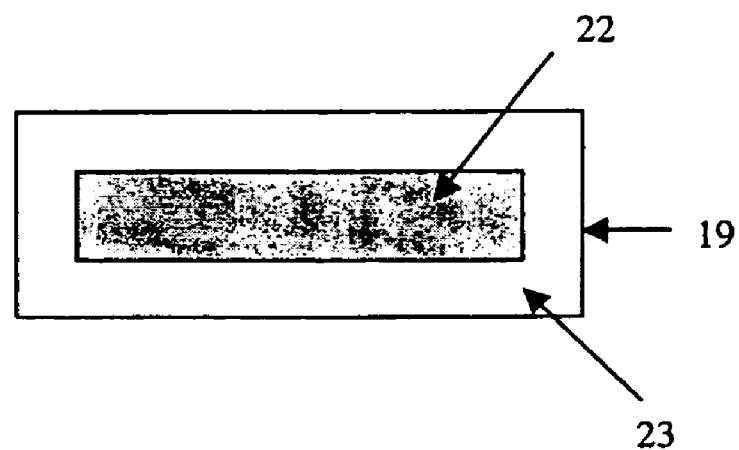

FIG. 5A shows the carrier substrate 21 having a plurality of unprocessed, integrateable chips 22 adhered to the carrier substrate within the plurality of slots 19. In one embodiment, a filler is used to fill the gap 23 formed between the interior edge of slot 19 and the peripheral edges of the chip 22 (FIG. 5B). In this way, a relatively continuous top surface is formed on the carrier substrate. In one embodiment, the top surfaces of the unprocessed chips and carrier substrate are polished to even out the common carrier surface topology in order to facilitate subsequent processing steps. In one embodiment, the surface is polished such that the top surfaces of the chips are in the same plane as the top surface of the substrate.

In one embodiment, the filler is selected to have the same or sustantially the same CTE as the integrated chip. In another embodiment, the filler is glass frit.

In one embodiment, the plurality of chips correspond to printhead integrated circuit devices and each of the individual carrier substrates 21A corresponds to a printhead of a single color. In another embodiment, the plurality of chips corresponds to printhead IC devices and each of the individual carrier substrates corresponds to a printhead containing all of the colors for printing for a given printer device.

In still another embodiment of the common carrier of the present invention, the plurality of chips is a component selected from a group consisting of an inkjet printhead, a thermal inkjet printhead, an integrated circuit, an ASIC, a MicroElectroMechanical System, and a fluidic device.

In the preceding description, numerous specific details are set forth, such as specific processing steps and materials in order to provide a through understanding of the present invention. It will be apparent, however, to one skilled in the art that these specific details need not be employed to practice the present invention. In other instances, well-known lithographic processing steps have not been described in detail in order to avoid unnecessarily obscuring the present invention.

In addition, although elements of the present invention have been described in conjunction with certain embodiments, it is appreciated that the invention can be implement in a variety of other ways. Consequently, it is to be understood that the particular embodiments shown and described by way of illustration is in no way intended to be considered limiting. Reference to the details of these embodiments is not intended to limit the scope of the claims which themselves recited only those features regarded as essential to the invention.

What is claimed is:

1. A method of forming a common carrier comprising the steps of:
    adhering an unprocessed, integrateable form of a plurality of chips on the upper surface of a carrier substrate according to a first placement alignment precision;
    lithographically processing the unprocessed, integrateable form of the plurality of chips to form a plurality of integrated chips on the upper surface, wherein the integrated chips are aligned with each other and the substrate with a second alignment precision having lithographic processing tolerances.

2. The method of forming the common carrier as described in claim 1 wherein the first alignment precision has a greater tolerance range than the lithographic processing tolerances.

3. The method of forming the common carrier as described in claim 1 wherein the first alignment precision has a tolerance in the range of +/−1 milimeter and the second alignment precision has a tolerance in the range of less than 1 micron.

4. The method of forming the common carrier as described in claim 1 further comprising the steps of:
    forming a plurality of slots within the upper surface of the carrier substrate according to the first alignment precision; and
    adhering the unprocessed, integrateable form of the integrated chips within the plurality of slots.

5. The method of forming the common carrier as described in claim 4 further comprising the step of depositing a filler so as to fill a peripheral gap between the interior edges of each of the slots and the peripheral edges of each of the unprocessed, integrateable form of the integrated chips when each unprocessed chip is adhered within each slot.

6. The method of forming the common carrier as described in claim 5 further comprising the step of polishing the upper surface of the plurality of chips to be in essentially the same parallel plane as the upper surface of the carrier substrate.

7. The method of forming the common carrier as described in claim 1 further comprising the step of adhering the unprocessed, integrateable form of the integrated chips directly on the upper surface of the carrier substrate such that the upper surface of the unprocessed, integrateable chips is in a parallel, but different, plane than the upper surface of the substrate camer.

8. The method of forming the common carrier as described in claim 7 further comprising the step of lithographically processing using curtain coating deposition.

9. A method of forming a common carrier, comprising:
    providing a carrier substrate;
    adhering chip substrates to the carrier substrate at different respective locations across the carrier substrate, wherein alignment between the adhered chip substrates is within a first alignment tolerance range; and
    lithographically processing the adhered chip substrates to form respective integrated structures on the adhered chip substrates, wherein alignment between the integrated structures respectively supported by different ones of the adhered chip substrates is within a second alignment tolerance range smaller than the first alignment tolerance range.

10. The method of claim 9, wherein the adhering comprises adhering the chip substrates to the carrier substrate with respective adhesive bonds.

11. The method of claim 9, wherein the carrier substrate, the adhesive bonds, and the integrated chips have substantially the same coefficients of thermal expansion (CTE).

12. The method of claim 11, wherein the carrier substrate and the adhesive bonds comprise the same material composition selected from polysilicon, glass, metal, and ceramic.

13. The method of claim 9, wherein the carrier substrate includes a plurality of slots, and the adhering comprises adhering ones of the chip substrates in respective ones of the slots.

14. The method of claim 13, further comprising disposing filler material in peripheral gaps between interior edges of the slots and peripheral edges of the response ones of the chip substrates in the slots.

15. The method of claim 14, wherein the filler material comprises glass frit.

16. The method of claim 14, wherein the filler material in each gap has a polished upper surface substantially coplanar with an upper surface of the carrier substrate.

17. The method of claim 13, wherein alignment between the slots of the carrier substrate is within the first alignment tolerance range.

18. The method of claim 13, wherein an upper surface of the carrier substrate and respective upper surfaces of the chip substrates are substantially coplanar.

19. The method of claim 18, wherein the integrated structures on the chip substrates are substantially non-coplanar with the upper surface of the carrier substrate.

20. The method of claim 9, wherein the integrated structure on each chip substrate comprises an electrically conductive node, and further comprising forming an interconnect electrically interconnecting ones of the electrically conductive nodes of the integrated structures.

21. The method of claim 9, wherein ones of the integrated structures are components of an inkjet printhead.

22. The method of claim 9, wherein the adhering comprises using a semiconductor chip placement tool to adhere the chip substrates to the carrier substrate with the first alignment tolerance range, and the second alignment tolerance range corresponds to a semiconductor lithographic process alignment tolerance range.

23. The method of claim 9, wherein the first alignment tolerance range is ±1 millimeter, and the second alignment tolerance range is smaller than 1 micrometer.

* * * * *